(12) United States Patent
Fukasawa et al.

(10) Patent No.: US 8,524,111 B2
(45) Date of Patent: Sep. 3, 2013

(54) CMP ABRASIVE SLURRY FOR POLISHING INSULATION FILM, POLISHING METHOD, AND SEMICONDUCTOR ELECTRONIC PART POLISHED BY THE POLISHING METHOD

(75) Inventors: Masato Fukasawa, Hitachi (JP); Kazuhiro Enomoto, Mito (JP); Chiaki Yamagishi, Hitachi (JP); Naoyuki Koyama, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 752 days.

(21) Appl. No.: 12/162,662

(22) PCT Filed: Jan. 31, 2007

(86) PCT No.: PCT/JP2007/051545
§ 371 (c)(1),
(2), (4) Date: Jul. 30, 2008

(87) PCT Pub. No.: WO2007/088868
PCT Pub. Date: Aug. 9, 2007

(65) Prior Publication Data
US 2009/0047786 A1 Feb. 19, 2009

(30) Foreign Application Priority Data

Jan. 31, 2006 (JP) ............... P2006-022354
Mar. 3, 2006 (JP) ............... P2006-057717

(51) Int. Cl.
*C09K 13/00* (2006.01)
*H01L 21/302* (2006.01)

(52) U.S. Cl.
USPC ...................... 252/79.1; 438/693

(58) Field of Classification Search
None
See application file for complete search history.

(56) References Cited

U.S. PATENT DOCUMENTS

| | | | |
|---|---|---|---|
| 2005/0159003 A1* | 7/2005 | Weinstein et al. | 438/690 |
| 2006/0099814 A1* | 5/2006 | Carter et al. | 438/692 |
| 2006/0148667 A1* | 7/2006 | Fukasawa et al. | 510/178 |
| 2007/0240366 A1* | 10/2007 | Ota et al. | 51/298 |

FOREIGN PATENT DOCUMENTS

| | | |
|---|---|---|
| JP | 2001-226666 | 8/2001 |
| JP | 2005-502188 | 1/2005 |
| JP | 2005-159351 | 6/2005 |
| WO | WO 02/094957 | 11/2002 |

(Continued)

OTHER PUBLICATIONS

Chinese Official Action dated Nov. 12, 2010, for CN Application No. 2007800248452.

(Continued)

*Primary Examiner* — Shamim Ahmed
*Assistant Examiner* — Bradford Gates
(74) *Attorney, Agent, or Firm* — Antonelli, Terry, Stout & Kraus, LLP.

(57) ABSTRACT

The present invention provides a CMP abrasive slurry for polishing insulation film, that allow efficiently and high-speed polishing of insulation films such as $SiO_2$ film and SiOC film in the CMP method of flattening an interlayer insulation film, a BPSG film, an insulation film for shallow trench isolation, or a wiring-insulating film layer, a polishing method by using the abrasive slurry, and a semiconductor electronic part polished by the polishing method. A CMP abrasive slurry for polishing insulation film containing cerium oxide particles, a dispersant, a water-soluble polymer having amino groups on the side chains and water, a polishing method by using the CMP abrasive slurry, and a semiconductor electronic part polished by the polishing method.

30 Claims, 1 Drawing Sheet

DURING POLISHING      WHEN POLISHING ENDS

(56) References Cited

FOREIGN PATENT DOCUMENTS

| WO | WO 2004/068570 A1 | 8/2004 |
| WO | WO 2004068570 A1 * | 8/2004 |
| WO | WO 2005/110679 A1 | 11/2005 |
| WO | WO 2005110679 A1 * | 11/2005 |
| WO | WO 2006-009160 | 1/2006 |

OTHER PUBLICATIONS

Chinese Official Action dated Jan. 8, 2010, for No. 2007800039349, and English translation; 10 pages total.
Taiwanese Official Action dated Apr. 21, 2011, for TW Application No. 10020323960.
Japanese Official Action dated May 10, 2011, for JP Application No. 2007-556875.
Korean Official Action dated Dec. 19, 2011, for KR Application No. 10-2011-7025658.
Taiwanese Official Action dated Dec. 23, 2011, for TW Application No. 096103479.
Korean Official Action dated Sep. 28, 2011, for KR Application No. 10-2008-7021286.
Japanese Official Action dated Nov. 29, 2011, for JP Application No. 2007-556875.
Japanese Official Action dated Aug. 23, 2011, for JP Application No. 2007-556875.
Taiwanese Official Action dated May 30, 2012, for TW Application No. 096103479.
Taiwanese Official Action dated Jun. 19, 2012, for TW Application No. 101106044.

* cited by examiner

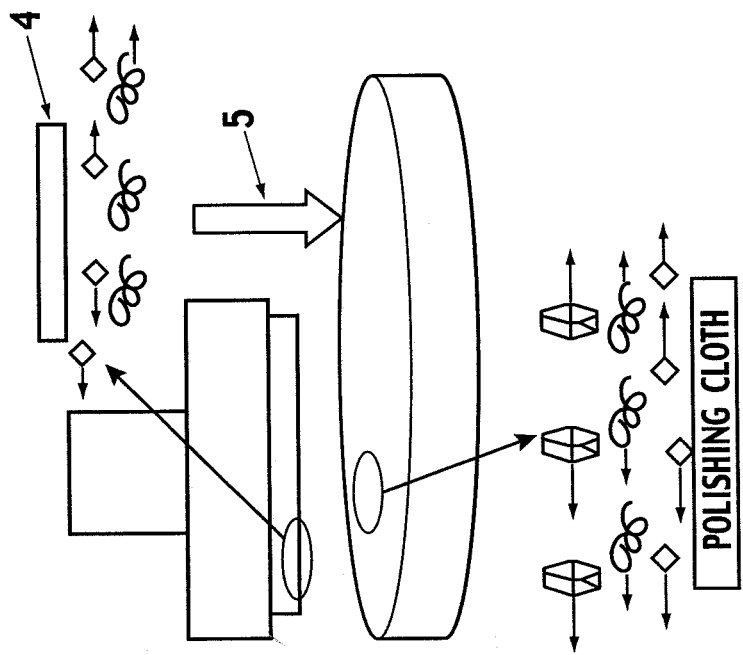
WHEN POLISHING ENDS
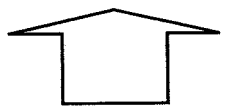
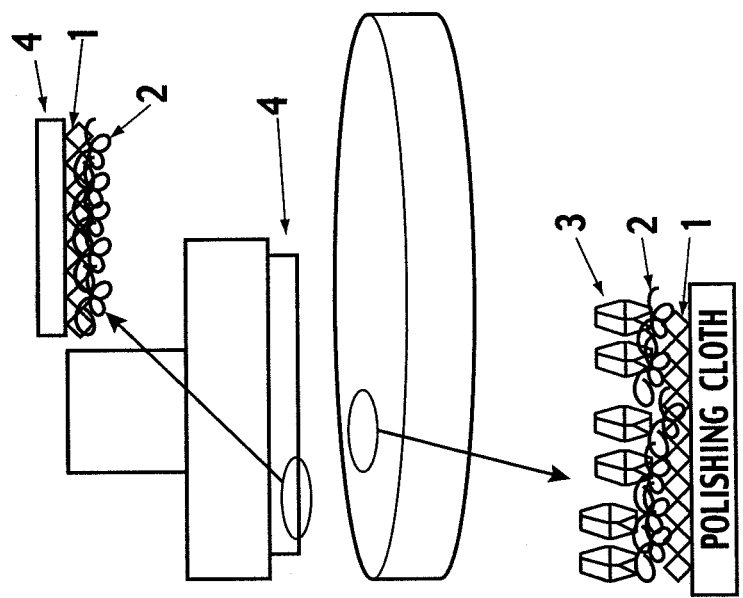
DURING POLISHING

CMP ABRASIVE SLURRY FOR POLISHING INSULATION FILM, POLISHING METHOD, AND SEMICONDUCTOR ELECTRONIC PART POLISHED BY THE POLISHING METHOD

TECHNICAL FIELD

The present invention relates to a CMP abrasive slurry for polishing insulation film, a polishing method by using the abrasive slurry, and a semiconductor electronic part polished by the polishing method.

BACKGROUND ART

Current ultra-ultra-large-scale integrated circuits demand increase in component-mounting density, and various microfabrication technologies are now under research and development. The design rule is already in the sub-half micron order. One of the technologies developed for satisfying the severe requirements for miniaturization is chemical mechanical polishing (CMP) technology.

The technology allows, in the production process for semiconductor devices, complete flattening of the light-irradiating layer and thus alleviates the load of light-irradiating technology, and increases the yield of semiconductor devices, and it is a technology essential, for example, in flattening of an interlayer insulation film or a BPSG film, performing shallow trench isolation, and the like.

Fumed silica-based abrasive slurries have been used commonly as CMP abrasives used in flattening an inorganic insulation film layer such as the silicon oxide insulation film formed by plasma CVD (Chemical Vapor Deposition) or low-pressure CVD in the production process for semiconductor devices.

The fumed silica-based abrasive slurries are produced by granulating silica particles, for example by converting silica particles into silicon tetrachloride under heat, and then adjusting the pH of the resulting particles. However, the fumed silica often caused a problem that it adhered to the polishing substrate and the deposited particles could not be removed completely even after washing.

In addition in the conventional CMP methods of flattening interlayer insulation film, the polishing rate is significantly dependent on the pattern of the film to be polished on the substrate; the polishing rate in the raised region varies significantly according to the difference in pattern density or size; polishing of the raised region is inevitably accompanied with polishing of the dent region; and thus, the convention CMP methods had a problem that it could not flatten the insulation film over the entire wafer surface at high level.

In the CMP method of flattening interlayer insulation film, it is necessary to terminate polishing of the interlayer insulation film in the middle, and a process control method of adjusting the polishing depth by polishing period is generally used. However, the method had a problem that the polishing rate varied distinctively not only by the difference in pattern level-difference shape but also by the condition of the polishing cloth and others, which prohibited easy process control.

In the generation of a design rule of 0.3 μm or more, LOCOS (local oxidation of silicon) has been used for separation of elements in integrated circuit. Further increase in processing density since then demanded a technology allowing narrower element separation width, and shallow trench isolation technology is now used more frequently. During shallow trench isolation, CMP is used for removal of the excess silicon oxide film formed on substrate, and a stopper film having a smaller polishing rate is formed beneath the silicon oxide film for termination of polishing. Silicon nitride, for example, is used for the stopper film, and the difference in polishing rate between the silicon oxide film and the stopper film is desirably larger.

On the other hand, cerium oxide abrasives have been used as abrasives for use on the surface of glasses such as photomask and lens. Cerium oxide particles are softer than silica or alumina particles, less likely to cause scratching on the polishing surface, and thus, useful for final mirror-surface polishing. However, such cerium oxide abrasive slurries for glass surface polishing contain dispersants containing sodium salts, and thus, could not be used as abrasives for semiconductor devices. Further, cerium oxide abrasives were more expensive than fumed silica abrasives, and thus, the abrasive was often used at low concentration. For that reason, the cerium oxide abrasive slurries had a problem that the efficiency of polishing the polishing surface was lower in the early polishing phase and the polishing period was elongated undesirably, compared to that by using the fumed silica abrasive.

Accordingly, proposed in Japanese Patent Application Laid-Open No. 2005-159351 was a method of polishing with an abrasive slurry containing fumed silica at higher concentration in the early coarse-polishing step for removal of the level difference on polishing surface and with an abrasive slurry containing cerium oxide particles at low concentration in the subsequent step of polishing until the stopper silicon nitride film.

An object of the present invention is to provide a CMP abrasive slurry for polishing insulation film that allows efficient and high-speed polishing of insulation films such as of $SiO_2$ and SiOC for use in the CMP method of flattening an interlayer insulation film, a BPSG film, an insulation film for shallow trench isolation, and a wiring-insulating film layer, a polishing method by using the abrasive slurry, and a semiconductor electronic part polished by the polishing method.

DISCLOSURE OF THE INVENTION

The present invention relates to (1) a CMP abrasive slurry for polishing insulation film, characterized by including cerium oxide particles, a dispersant, a water-soluble polymer having amino groups on the side chains, and water.

The present invention also relates to (2) the CMP abrasive slurry for polishing insulation film according to (1), wherein the abrasive slurry described in (1) has a polishing rate, as determined by using the same amount of cerium oxide particles under the same polishing condition, 1.2 times or more higher than that of an abrasive slurry according to (1) containing no water-soluble polymer having amino groups on the side chains.

The present invention also relates to (3) the CMP abrasive for polishing insulation film according to (1) or (2), wherein the water-soluble polymer having amino groups on the side chains is a polymer prepared by polymerization of at least one polymerizable amino compound represented by the following General Formula (I):

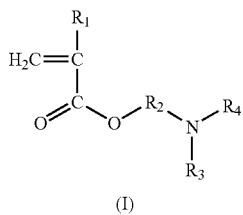

(in Formula (I), $R_1$ represents a hydrogen atom, a lower alkyl group, a phenyl group, a benzyl group, a halogen-substituted lower alkyl group, or a cyano group; $R_2$ represents a $C_1$-$C_{18}$ alkylene group; $R_3$ represents a hydrogen atom or a $C_1$-$C_{18}$ alkyl group; and $R_4$ represents a $C_1$-$C_{18}$ alkyl group), or the following General Formula (II):

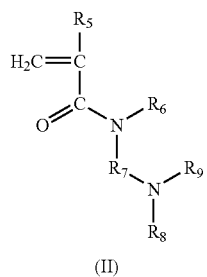

(in Formula (II), $R_5$ represents a hydrogen atom, a lower alkyl group, a phenyl group, a benzyl group, a halogen-substituted lower alkyl group, or a cyano group; $R_6$ represents a hydrogen atom or a $C_1$-$C_{18}$ alkyl group; $R_7$ represents a $C_1$-$C_{18}$ alkylene group; $R_8$ represents a hydrogen atom or a $C_1$-$C_{18}$ alkyl group; and $R_9$ represents a $C_1$-$C_{18}$ alkyl group).

The present invention also relates to (4) the CMP abrasive slurry for polishing insulation film according to any one of (1) to (3), wherein the water-soluble polymer having amino groups on the side chains is a polymer prepared by polymerization of the polymerizable amino compound according to (3) and at least one compound represented by the following General Formula (III):

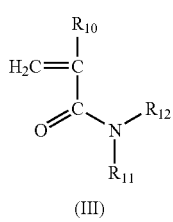

(in Formula (III), $R_{10}$ represents a hydrogen atom, a lower alkyl group, a phenyl group, a benzyl group, a halogen-substituted lower alkyl group, or a cyano group; $R_{11}$ and $R_{12}$ each represent a hydrogen atom, a $C_1$-$C_{18}$ alkyl group, a lower hydroxyalkylene group, or an acyl group; and $R_{11}$ and $R_{12}$ may bind to each other, forming a morpholino, thiomorpholino, pyrrolidino, or piperidino group).

The present invention also relates to (5) the CMP abrasive slurry for polishing insulation film according to any one of (1) to (4), wherein the addition amount of the water-soluble polymer having amino groups on the side chains is 0.00001 wt part or more and 1 wt part or less with respect to 100 wt parts of the abrasive slurry.

The present invention also relates to (6) the CMP abrasive slurry for polishing insulation film according to any one of (1) to (5), further containing a water-soluble nonionic compound.

The present invention also relates to (7) the CMP abrasive slurry for polishing insulation film according to (6), wherein the addition amount of the water-soluble nonionic compound is 0.00001 wt part or more and 1 wt part or less with respect to 100 wt parts of the abrasive slurry.

The present invention also relates to (8) the CMP abrasive slurry for polishing insulation film according to any one of (1) to (7), wherein the average diameter of the cerium oxide particles is 80 nm to 1000 nm and the addition amount of the cerium oxide particles is 0.1 wt part or more and 15 wt parts or less with respect to 100 wt parts of the abrasive slurry.

The present invention also relates to (9) the CMP abrasive slurry for polishing insulation film according to (1), wherein a cerium oxide slurry containing the cerium oxide particles, the dispersant and water (liquid A) and a supplementary solution containing the water-soluble polymer having amino groups on the side chains and water (liquid B) are supplied after mixed previously before polishing.

The present invention also relates to (10) the CMP abrasive slurry for polishing insulation film according to (6), wherein a cerium oxide slurry containing the cerium oxide particles, the dispersant and water (liquid A) and a supplementary solution containing the water-soluble polymer having amino groups on the side chains, water and an aqueous nonionic compound (liquid C) are supplied after mixed previously before polishing.

The present invention also relates to (11) a method of polishing substrate, characterized by polishing a film to be polished by pressing a substrate carrying the film to be polished against a polishing cloth on a polishing surface plate and moving the substrate and the polishing surface plate relatively to each other while supplying the CMP abrasive slurry into the space between the film to be polished and the polishing cloth under pressure.

The present invention also relates to (12) the CMP abrasive slurry for polishing insulation film according to any one of (1) to (10), wherein the cerium oxide particles and the water-soluble polymer having amino groups on the side chains are adsorbed uniformly on the polishing cloth and the uniformity of polishing rate distribution is 0.1% to 10% because of uniform action of the cerium oxide particles on the film to be polished.

The present invention also relates to (13) the CMP abrasive slurry for polishing insulation film according to (6), wherein the number of the polishing defects remaining on the polishing substrate can be reduced to 90% or less by washing off the cerium oxide particles adsorbed on the polishing cloth after polishing with water or an aqueous solution.

The present invention also relates to (14) the CMP abrasive slurry for polishing insulation film according to any one of (1) to (10) and (12) to (13), wherein the abrasive slurry has a polishing rate, as determined by using the same amount of cerium oxide particles under the same polishing condition, 1.2 times or more higher than that of the abrasive slurry according to any one of (1) to (10) and (12) to (13) containing no water-soluble polymer having amino groups on the side chains.

The present invention relates to (15) the CMP abrasive slurry for polishing insulation film according to any one of (1) to (10) and (12) to (13), wherein the abrasive slurry has a polishing rate in the raised region of the insulation film surface having level difference, as determined by using the same amount of cerium oxide particles under the same polishing condition, 1.5 times or more higher than that of the abrasive slurry according to any one of (1) to (10) and (12) to (13) containing no water-soluble polymer having amino groups on the side chains.

The present invention also relates to (16) the CMP abrasive slurry for polishing insulation film according to any one of (1) to (10) and (12) to (15), wherein the abrasive slurry can be used as an alternative for a flattening abrasive slurry containing fumed silica as the principal component.

The present invention also relates to (17) a polishing method, characterized in that the polishing process of polishing with an abrasive slurry containing fumed silica as the principal component in the initial level difference coarse polishing step is carried out by using the CMP abrasive slurry for polishing insulation film according to any one of (1) to (10) and (12) to (16).

The present invention also relates to (18) a polishing method, characterized in that a substrate carrying a film to be polished having level difference is polished by using the CMP abrasive slurry for polishing insulation film according to any one of (1) to (10) and (12) to (17).

The present invention also relates to (19) the polishing method according to (18), wherein the film to be polished includes $SiO_2$, SiOC and BPSG films.

The present invention also relates to (20) the polishing method according to (18) or (19), wherein the substrate carrying a film to be polished having level difference is an electronic part.

The present invention also relates to (21) a semiconductor electronic part, characterized by being polished by the polishing method according to any one of (11) and (17) to (20).

The present invention also relates to (22) a method of polishing substrate, characterized by polishing a film to be polished by pressing a substrate carrying the film to be polished against a polishing cloth on a polishing surface plate and moving the substrate and the polishing surface plate relatively to each other while supplying the CMP abrasive slurry into the space between the film to be polished and the polishing cloth under pressure, wherein the CMP abrasive slurry contains cerium oxide particles and the cerium oxide particles are held on the polishing cloth.

The present invention also relates to (23) the method of polishing substrate according to (22), wherein the cerium oxide particles are held on the polishing cloth via the water-soluble polymer having amino groups on the side chains.

The present invention also relates to (24) the method of polishing substrate according to (22), wherein the cerium oxide particles are held on the polishing cloth via the water-soluble polymer having amino groups on the side chains and a water-soluble nonionic compound.

The present invention relates to (25) the method of polishing substrate according to any one of (22) to (24), wherein the polishing cloth was washed with water or an aqueous solution during or after polishing.

The present invention provides a CMP abrasive slurry for polishing insulation film that allows efficient and high-speed polishing of insulation films such as $SiO_2$ film and SiOC film in the CMP method of flattening an interlayer insulation film, a BPSG film, a insulation film for shallow trench isolation, and a wiring-insulating film layer, a polishing method by using the abrasive slurry, and a semiconductor electronic part polished by the polishing method. According to the present invention, it is also possible to polish only by using the CMP abrasive slurry according to the present invention, in the polishing processes that demanded multiple abrasives: a fumed silica abrasive and a cerium oxide abrasive. In addition, the present invention provides a CMP abrasive slurry for high-throughput and cost-effective polishing of insulation films.

BRIEF DESCRIPTION OF THE DRAWINGS

FIG. 1 is a schematic view illustrating the adsorption mechanism of cerium oxide particles and additive components.

BEST MODE FOR CARRYING OUT THE INVENTION

The CMP abrasive slurry for polishing insulating film according to the present invention is characterized by containing cerium oxide particles, a dispersant, a water-soluble polymer having amino groups on the side chains and water.

The cerium oxide particles used as abrasive in the present invention are not particularly limited, and prepared, for example, by oxidizing a cerium compound such as carbonate, nitrate, sulfate, or oxalate salt. The cerium oxide abrasive slurries for use in polishing of a silicon oxide insulation film formed, for example, by TEOS-CVD (Tetraethyl orthosilicate-Chemical Vapor Deposition) allow high-speed polishing, when its primary grain diameter is larger and its crystalline distortion is smaller, or its crystallinity is higher, but often lead to polishing scratch. Accordingly, the cerium oxide particles for use in the present invention preferably have a cerium oxide particle crystallite diameter of 5 nm or more and 300 nm or less.

For use in polishing of semiconductor electronic parts, the cerium oxide particles preferably have alkali metal and halogen contents respectively of 10 ppm or less.

In the present invention, the cerium oxide particles can be prepared, for example, by a method of sintering a cerium compound such as carbonate, nitrate, sulfate, or oxalate salt or a method of oxidizing it for example with hydrogen peroxide. The sintering temperature is preferably 350° C. or higher and 900° C. or lower.

The cerium oxide particles produced by the method above are preferably pulverized mechanically, because they are aggregated. The pulverization method is preferably a dry pulverization method for example in a jet mill or a wet pulverization method for example in a planetary ball mill or a bead mill. The jet mills are described, for example, in Kagaku Kogyo Ronbunshu (J. of Chemical Industry), 6(5), 1980, p. 527 to 532.

The CMP abrasive slurry for polishing insulating film according to the present invention is prepared, for example, by blending cerium oxide particles, a dispersant and water into a cerium oxide particle-dispersed dispersion and then adding a water-soluble polymer having amino groups on the side chains, but the method is only an example, and the order of adding respective components is not particularly limited thereto. When cerium oxide particles are dispersed, the concentration of the cerium oxide particles in the dispersion is not particularly limited, but preferably 0.5 wt % or more and 20 wt % or less, from the point of handling of the dispersion.

In the dispersant for use in the present invention, which will be applied to semiconductor chip polishing, the contents of alkali metals such as sodium and potassium ions, halogen atoms, and sulfur atom are preferably adjusted to 10 ppm or less, and the polymerization component for use is preferably, for example, a polymer dispersant containing ammonium acrylate salt, particularly preferably ammonium polyacrylate.

Alternatively, a dispersant containing the polymer dispersant containing ammonium acrylate salt and at least one dispersant selected from water-soluble anionic dispersants, water-soluble nonionic dispersants, water-soluble cationic dispersants, and water-soluble amphoteric dispersants may be used, and thus, two or more dispersants may be used in combination.

Examples of the water-soluble anionic dispersants include triethanolamine laurylsulfate, ammonium laurylsulfate, triethanolamine polyoxyethylene alkylether sulfates, special polycarboxylic acid-based polymer dispersants, and the like.

Examples of the water-soluble nonionic dispersants include polyoxyethylene laurylether, polyoxyethylene cetylether, polyoxyethylene stearylether, polyoxyethylene oleylether, polyoxyethylene higher alcohol ethers, polyoxyethylene octylphenylether, polyoxyethylene nonylphenylether, polyoxyalkylene alkylethers, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol monostearate, polyethylene glycol distearate, polyethylene glycol monooleate, polyoxyethylene alkylamine, polyoxyethylene hydrogenated castor oil, alkylalkanol amides and the like.

Examples of the water-soluble cationic dispersants include polyvinylpyrrolidone, coconut amine acetate, stearylamine acetate, and the like; and examples of the water-soluble amphoteric dispersants include laurylbetaine, stearylbetaine, lauryl dimethylamine oxide, 2-alkyl-N-carboxymethyl-N-hydroxyethylimidazolinium betaines, and the like.

For dispersion of the cerium oxide particle in CMP abrasive slurry and prevention of sedimentation and from the point of the relationship between the polishing scratch and the dispersant addition amount, the addition amount of the dispersant is preferably in the range of 0.01 wt part or more and 2.0 wt parts or less, more preferably in the range of 0.2 wt part or more and 1.2 wt parts or less, with respect to 100 wt parts of the cerium oxide particles. The molecular weight of the dispersant is preferably 100 to 50,000, more preferably 1,000 to 10,000. A dispersant molecular weight of less than 100 may lead to insufficient polishing rate when a silicon oxide or a silicon nitride film is polished, while a dispersant molecular weight of more than 50,000 to increase in viscosity and deterioration in storage stability of the CMP abrasive slurry.

The cerium oxide particles are dispersed in water, for example, by dispersion in a common stirrer, or in a dispersing apparatus such as homogenizer, ultrasonic dispersing machine, or wet ball mill.

The average diameter of the cerium oxide particles in the CMP abrasive slurry thus prepared is preferably 80 to 1,000 nm, more preferably 80 to 300 nm. A cerium oxide particle average diameter of less than 0.01 µm may lead to deterioration in polishing rate, while an average diameter of more than 1.0 µm to generation of polishing scratch.

The water-soluble polymer having amino groups on the side chains according to the present invention is a polymer obtained by polymerization of at least one polymerizable amino compounds represented by the following General Formula (I):

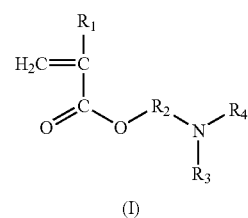

[Formula 4]

(I)

(in Formula (I), $R_1$ represents a hydrogen atom, a lower alkyl group, a phenyl group, a benzyl group, a halogen-substituted lower alkyl group, or a cyano group; $R_2$ represents a $C_1$-$C_{18}$ alkylene group; $R_3$ represents a hydrogen atom or a $C_1$-$C_{18}$ alkyl group; and $R_4$ represents a $C_1$-$C_{18}$ alkyl group), or the following General Formula (II):

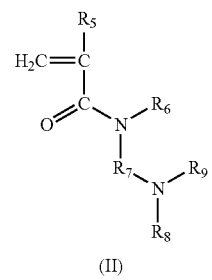

[Formula 5]

(II)

(in Formula (II), $R_5$ represents a hydrogen atom, a lower alkyl group, a phenyl group, a benzyl group, a halogen-substituted lower alkyl group, or a cyano group; $R_6$ represents a hydrogen atom or a $C_1$-$C_{18}$ alkyl group; $R_7$ represents a $C_1$-$C_{18}$ alkylene group; $R_8$ represents a hydrogen atom or a $C_1$-$C_{18}$ alkyl group; and $R_9$ represents a $C_1$-$C_{18}$ alkyl group).

The lower alkyl groups of $R_1$ in General Formula (I) or $R_5$ in Formula (II) is an alkyl group having 1 to 5 carbon atoms, and examples thereof include methyl, ethyl, propyl, isopropyl, butyl, isobutyl, tertiary-butyl, pentyl, and other groups, and among them, alkyl groups having 1 to 3 carbon atoms are preferable, and a methyl group is still more preferable. The halogen-substituted lower alkyl group of $R_1$ in General Formula (I) or $R_5$ in Formula (II) is an alkyl group having 1 to 5 carbon atoms, one or more hydrogen atoms of which are substituted with halogen atoms, and examples thereof include monofluoromethyl, monochloromethyl, monobromomethyl, difluoromethyl, dichloromethyl, dibromomethyl, trifluoromethyl, trichloromethyl, tribromomethyl, trifluoroethyl, trichloroethyl, pentafluoroethyl, tetrafluoropropyl, heptafluoropropyl, octafluoropentyl, and other groups; among them, fluorine-substituted lower alkyl groups are preferable; and difluoromethyl and trifluoromethyl groups are more preferable. The group $R_2$ in General Formula (I) or $R_7$ in Formula (II) is a $C_1$-$C_{18}$ alkylene group, and examples thereof include methylene, dimethylene, trimethylene, tetramethylene, pentamethylene, hexamethylene, heptamethylene, octamethylene, nonamethylene, decamethylene, undecamethylene, dodecamethylene, tridecamethylene, tetradecamethylene, pentadecamethylene, hexadecamethylene, heptadecamethylene, octadecamethylene, and other groups; among them, $C_1$-$C_5$ alkylene groups are preferable; and $C_1$-$C_3$ alkylene groups are more preferable. Examples of the $C_1$-$C_{18}$ alkyl groups of $R_3$ and $R_4$ in General Formula (I) or $R_8$ and $R_9$ in Formula (II) include methyl, ethyl, propyl, isopropyl, butyl, isobutyl, tertiary-butyl, pentyl, hexyl, heptyl, octyl, nonyl, decyl, undecyl, dodecyl, tridecyl, tetradecyl, pentadecyl, hexadecyl, heptadecyl, octadecyl and other groups; among them, $C_1$-$C_5$ alkyl groups are preferable; and $C_1$-$C_3$ alkyl groups are more preferable.

Specific examples of the polymerizable amino compounds represented by General Formula (I) or (II) include aminoethyl acrylate, N-methylaminoethyl acrylate, N,N-dimethylaminoethyl acrylate, N-ethylaminoethyl acrylate, N,N-diethylaminoethyl acrylate, N-methylaminopropyl acrylate, N,N-dimethylaminopropyl acrylate, N-ethylaminopropyl acrylate, aminopropyl acrylate, N-ethylaminopropyl acrylate, N,N-diethylaminopropyl acrylate, aminoethyl methacrylate, N-methylaminoethyl methacrylate, N,N-dimethylaminoethyl methacrylate, N-ethylaminoethyl methacrylate, N,N-diethylaminoethyl methacrylate, aminopropyl methacrylate, N-methylaminopropyl methacrylate, N,N-dimethylaminopropyl methacrylate, N-ethylaminopropyl methacrylate, N,N-diethylaminopropyl methacrylate, aminopropylacrylamide, N-methylaminopropylacrylamide, N,N-dimethylaminopropylacrylamide, N-ethylaminopropylacrylamide, N,N-diethylaminopropylacrylamide, aminopropyl methacrylamide, N-methylaminopropyl methacrylamide, N,N-dimethylaminopropyl methacrylamide, N-ethylaminopropyl methacrylamide, N,N-diethylaminopropyl methacrylamide, and the like. Among them, N,N-disubstituted polymerizable amino compounds are preferable; and N,N-dimethylaminoethyl acrylate, N,N-dimethylaminopropyl methacrylate, and N,N-dimethylaminopropyl methacrylamide are more preferable.

In the present invention, the polymerizable amino compounds represented by General Formula (I) or (II) may be used alone or in combination of two or more.

In addition, the water-soluble polymer having amino groups on the side chains according to the present invention may be a copolymer obtained by polymerization of a polymerizable amino compound represented by General Formula (I) or (II) with another polymerizable monomer. Examples of the monomer components include acrylic acid, $C_1$-$C_{18}$ acrylic esters, methacrylic acid, $C_1$-$C_{18}$ methacrylic esters, vinyl alcohols, acrylonitrile, vinylpyrrolidone, vinylpyridine, and the compounds represented by the following General Formula (III), and these monomers may be used alone or in combination of two or more.

Examples of the lower alkyl group, the halogen-substituted lower alkyl group, and the $C_1$-$C_{18}$ alkyl group in the compound represented by General Formula (III)

[Formula 6]

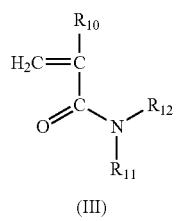

(III)

(in Formula (III), $R_{10}$ represents a hydrogen atom, a lower alkyl group, a phenyl group, a benzyl group, a halogen-substituted lower alkyl group, or a cyano group; $R_{11}$ and $R_{12}$ each represent a hydrogen atom, a $C_1$-$C_{18}$ alkyl group, a lower hydroxyalkylene group, or an acyl group; and $R_{11}$ and $R_{12}$ may bind to each other, forming a morpholino, thiomorpholino, pyrrolidino, or piperidino group) are the same as those described in General Formula (I) or (II). Examples of the lower hydroxyalkylene group in General Formula (III) include hydroxymethylene, hydroxyethylene, hydroxypropylene, hydroxybutylene, hydroxypentylene and other groups; among them, $C_1$-$C_3$ lower hydroxyalkylene groups are preferable; and a hydroxymethylene group is more preferable. Examples of the acyl group in General Formula (III) include acetyl, propionyl, butyryl, isobutyryl, and other groups, and among them, an acetyl group is preferable.

Specific examples of the compounds represented by General Formula (III) include acrylamide, methylacrylamide, N-methylacrylamide, N-ethylacrylamide, N-propylacrylamide, N-isopropylacrylamide, N-butylacrylamide, N-isobutylacrylamide, N-tertiary butylacrylamide, N-heptylacrylamide, N-octylacrylamide, N-tertiary octylacrylamide, N-dodecylacrylamide, N-octadecylacrylamide, N-methylolacrylamide, N-acetylacrylamide, N-diacetone acrylamide, N-methylmethacrylamide, N-ethylmethacrylamide, N-propylmethacrylamide, N-isopropyl methacrylamide, N-butylmethacrylamide, N-isobutylmethacrylamide, N-tertiary-butylmethacrylamide, N-heptylmethacrylamide, N-octylmethacrylamide, N-tertiary octylmethacrylamide, N-dodecylmethacrylamide, N-octadecylmethacrylamide, N-methylolmethacrylamide, N-acetylmethacrylamide, N-diacetonemethacrylamide, N,N-dimethylacrylamide, N,N-diethylacrylamide, N,N-dipropylacrylamide, N,N-diisopropylacrylamide, N,N-dibutylacrylamide, N,N-diisobutylacrylamide, N,N-ditertiary-butylacrylamide, N,N-diheptylacrylamide, N,N-dioctylacrylamide, N,N-ditertiary-octylacrylamide, N,N-didodecylacrylamide, N,N-dioctadecylacrylamide, N,N-dimethylol acrylamide, N,N-diacetylacrylamide, N,N-diacetoneacrylamide, N,N-dimethylmethacrylamide, N,N-diethylmethacrylamide, N,N-dipropylmethacrylamide, N,N-diisopropylmethacrylamide, N,N-dibutylmethacrylamide, N,N-diisobutylmethacrylamide, N,N-ditertiary-butylmethacrylamide, N,N-diheptylmethacrylamide, N,N-dioctylmethacrylamide, N,N-ditertiary-octylmethacrylamide, N,N-didodecylmethacrylamide, N,N-dioctadecylmethacrylamide, N,N-dimethylolmethacrylamide, N,N-diacetylmethacrylamide, N,N-diacetonemethacrylamide, acryloylpiperidine, acryloylmorpholine, acryloylthiomorpholine, acryloylpyrrolidine, and the like. N,N-Disubstituted compounds are preferable among them, and N,N-dimethylacrylamide and acryloylmorpholine are more preferable.

The water-soluble polymer having amino groups on the side chains according to the present invention is obtained by polymerizing a polymerizable amino compound represented by General Formula (I) or (II) with optional any other polymerizable monomer by a common method such as radical polymerization.

The weight-average molecular weight of the water-soluble polymer having amino groups on the side chains according to the present invention is 500 or more, preferably 500 to 1,000,000, particularly preferably 500 to 5,000. A water-soluble polymer having a weight-average molecular weight of less than 500 may absorb to the film insufficiently.

The addition amount of the water-soluble polymer having amino groups on the side chains is preferably in the range of 0.00001 wt part or more and 1 wt part or less, more preferably in the range of 0.0001 wt part or more and 0.5 wt part or less, with respect to 100 wt parts of the CMP abrasive slurry. An insufficient addition amount of the water-soluble polymer having amino groups on the side chains often results in unsatisfactory high-speed polishing characteristics, while an excessive addition amount leads to increase in viscosity and deterioration in flowability of the abrasive slurry.

In addition, the high-speed CMP abrasive slurry for polishing insulation film according to the present invention may be used in combination with another water-soluble polymer.

The water-soluble polymer is not particularly limited, if it has a weight-average molecular weight of 500 or more, and examples thereof include polysaccharides such as alginic acid, pectic acid, carboxymethylcellulose, agar, curdlan, and pullulan; polycarboxylic acids such as polyaspartic acid, polyglutamic acid, polylysine, polymalic acid, polymethacrylic acid, ammonium polymethacrylate salt, sodium polymethacrylate salt, polyamide acid, polymaleic acid, polyitaconic acid, polyfumaric acid, poly(p-styrenecarboxylic acid), polyacrylic acid, polyacrylamide, aminopolyacrylamide, ammonium polyacrylate salt, sodium polyacrylate salt, polyamide acid, polyamide acid ammonium salt, polyamide acid sodium salt, and polyglyoxylic acid, and the salts thereof; vinyl polymers such as polyvinylalcohol, polyvinylpyrrolidone, and polyacrolein; and the like.

The CMP abrasive slurry according to the present invention may contain a water-soluble nonionic compound additionally. Water-soluble nonionic compounds having a molecular weight of 100 to 1,000,000 are preferable, and those of 100 to 100,000 more preferable. A water-soluble nonionic compound having a molecular weight of more than 1,000,000 may lead to increase in the viscosity of the CMP abrasive slurry and aggregation of cerium oxide particles. Alternatively, water-soluble nonionic compounds having a molecular weight of less than 100 are often not liquid at room temperature.

The term "water-soluble" as used in the water-soluble nonionic compound indicates that the nonionic compound has a solubility of 0.01 g or more in 100 g of pure water. A nonionic compound that is soluble in an amount of 0.01 g without generation of suspended matter is considered to be dissolved. Unfavorably when the concentration of the nonionic compound soluble in pure water is low, the washing efficiency declines.

Alternatively, the term "nonionic" as used in the water-soluble nonionic compound is relevant to the electric potential of cerium oxide particles when a trace amount of cerium oxide particles are dispersed in an aqueous solution containing only a water-soluble nonionic compound, and the zeta potential is preferably in the range of −15 mV to +15 mV, more preferably in the range of −5 mV to +5 mV. A zeta potential of more than +15 mV leads to increase in adhesiveness between the insulation film of a semiconductor substrate and its cerium oxide particles for polishing, while a zeta potential of less than −15 mV leads to drastic decline of the polishing efficiency of the cerium oxide particles.

Examples of the water-soluble nonionic compounds include polyoxyethylene laurylether, polyoxyethylene cetylether, polyoxyethylene stearylether, polyoxyethylene oleylether, polyoxyethylene higher alcohol ethers, polyoxyethylene octylphenylether, polyoxyethylene nonylphenylether, polyoxyalkylene alkylethers, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol, polyethylene glycol monostearate, polyethylene glycol distearate, polyethylene glycol monooleate, polyoxyethylene alkylamines, polyoxyethylene hydrogenated castor oil, propylene glycol monopropylether, ethylene glycol dimethyl acetate, 1-decyne, 5-decyne-2,4,7,9-tetramethyl-5-decyne-4,7-diol, 2,4,7,9-tetramethyl-5-decyne-4,7-diol ethoxylate, propylene glycol monopropylether, ethylene glycol monomethyl acetate, and the like. Among them, polyoxyethylene sorbitan tristearate, polyethylene glycol, polyethylene glycol monostearate, 5-decyne-2,4,7,9-tetramethyl-5-decyne-4,7-diol and the like are preferable.

In the present invention, there are substances having the function of the dispersant and also the function of the water-soluble polymer having amino groups on the side chains, the water-soluble nonionic compound or the other water-soluble polymer. In such a case, the same one substance may be used, or alternatively different substances may be used, as the dispersant and also as the water-soluble polymer having amino groups on the side chains, the water-soluble nonionic compound or the other water-soluble polymer. When such a substance is used as the water-soluble polymer having amino groups on the side chains, the water-soluble nonionic compound or the other water-soluble polymer, it should often be used in an amount larger than that of the dispersant, and thus, for prevention of aggregation of the cerium oxide particles, it is preferably stored as in a two-liquid system or as in a single liquid system while the pH thereof is kept low.

The addition amount of the water-soluble nonionic compound is preferably 0.00001 wt parts or more and 1 wt part or less, more preferably 0.01 wt part or more and 0.5 wt part or less, and still more preferably 0.03 wt part or more and 0.2 wt part or less, with respect to 100 wt parts of the CMP abrasive slurry. An additional amount of the water-soluble nonionic compound at less than 0.00001 wt part may lead to deterioration in washing efficiency and generation of multiple polishing defects on the wafer surface, while an addition amount of more than 1 wt part, to increase in the viscosity of the CMP abrasive slurry and aggregation of the cerium oxide particles.

In the present description, the term "polishing defects" means defects generated during polishing, including polishing scratch on the polishing surface and deposition of abrasive, polymeric compound gel and others on the polishing surface.

The average diameter of the cerium oxide particles contained in the CMP abrasive is preferably 80 to 1000 nm, more preferably 100 to 400 nm, and still more preferably 130 to 300 nm. Cerium oxide particles having an average diameter of less than 80 nm may lead to undesired low speed polishing rate, while cerium oxide particles having an average diameter of more than 1000 nm to multiple polishing scratches generated on the wafer surface.

The addition amount of the cerium oxide particles is preferably 0.1 wt part or more and 15 wt parts or less, more preferably 0.1 wt part or more and 1 wt part or less, and still more preferably 0.2 wt part or more and 1.2 wt parts or less, with respect to 100 wt parts of the CMP abrasive slurry. An addition amount of the cerium oxide particles at less than 0.1 wt part may prohibit required polishing rate, while an addition amount of more than 15 wt parts may lead to generation of polishing defects.

In addition to the components described above, the CMP abrasive slurry according to the present invention may contain additives commonly added to abrasive slurry such as colorants (e.g., dyes or pigments) and an pH adjuster in amounts in the range that does not impair the operation and effect of the abrasive slurry.

The pH of the CMP abrasive slurry according to the present invention is preferably 4 or more and 10 or less, more preferably 5 or more and 9 or less. The pH can be adjusted properly by addition of an acid or alkali component.

The CMP abrasive slurry according to the present invention may be stored as a single-liquid abrasive slurry containing cerium oxide particles, a dispersant, a water-soluble polymer having amino groups on the side chains and water. Alternatively, it may be stored as a two-liquid abrasive slurry consisting of a cerium oxide slurry (liquid A) containing cerium oxide particles, a dispersant and water and a supplementary solution (liquid B) containing a water-soluble polymer having amino groups on the side chains and water, or as a two-liquid abrasive slurry consisting of a cerium oxide slurry (liquid A) containing cerium oxide particles, a dispersant and water and a supplementary solution (liquid C) containing a water-soluble polymer having amino groups on the side chains, water and a water-soluble nonionic compound. Both the single-liquid abrasive slurry and the two-liquid abrasive slurry give favorable stabilized properties. When the abrasive slurry is stored in a two-liquid abrasive slurry, the properties such as polishing rate can be controlled by arbitrary adjustment of the blending rate of the two liquids. In the case of the two-liquid abrasive slurry, the abrasive slurry is used, for example, by a method of feeding the cerium oxide slurry and the supplementary solution via separated pipes and mixing the liquids at the confluence immediately before supply pipe outlet and then feeding the mixture onto a polishing surface plate, a method of mixing the cerium oxide slurry with the supplementary solution immediately before polishing, or a method of feeding the cerium oxide slurry and the supplementary solution separately onto a polishing surface plate and mixing the liquids on the polishing surface plate. Alternatively in the case of a two-liquid abrasive slurry, the abrasive slurry may be used for polishing as it is added with water additionally.

The cerium oxide particles and the water-soluble polymer having amino groups on the side chains in the CMP abrasive slurry according to the present invention are adsorbed uniformly on a polishing cloth. The cerium oxide particles seem to be adsorbed on the polishing cloth via the water-soluble compound containing amino groups on the side chains. Alternatively, the cerium oxide particles, the water-soluble polymer having amino groups on the side chains and the water-soluble nonionic compound in the CMP abrasive slurry according to the present invention are absorbed uniformly on the polishing cloth. The cerium oxide particles seem to be adsorbed on the polishing cloth via the water-soluble compound containing amino groups on the side chains and the water-soluble nonionic compound. Accordingly, an equal amount of cerium oxide particles are held on the entire surface of the polishing cloth, and the cerium oxide particles function uniformly on the film to be polished, consequently increasing uniformity of the polishing rate distribution. The "uniformity" is defined by a value of the standard deviation of polished-film thickness distribution (measured at 65 points) divided by the average polished film thickness (percent) when a Si wafer carrying a 8-inch p-TEOS film (thickness: 1 µm) is polished, and the value is preferably 0.1 to 10%. A smaller value indicates higher uniformity, and thus, a value of more than 10% may affect the yield of semiconductor device. The composition of the CMP abrasive slurry is adjusted properly to make the value not larger than 10%.

With the CMP abrasive slurry according to the present invention, it is possible to reduce the polishing defect on the polishing substrate, by washing off the cerium oxide particle remaining adsorbed on the polishing cloth after polishing with water or an aqueous solution. The water is preferably pure water. Examples of the aqueous solutions include aqueous nitric acid, aqueous sulfuric acid, aqueous ammonia, aqueous nonionic compound solution, and the like. As for the operational method, for example, the cerium oxide particles, the water-soluble compound containing amino groups on the side chains, and the water-soluble nonionic compound are removed by applying pure water onto the polishing cloth for 2 to 10 seconds after polishing while the holder holding the substrate carrying a film to be polished and the polishing cloth (surface plate) are rotated without any polishing load, possibly reducing the defective components deposited on the surface of the film to be polished.

The water-soluble nonionic compound is effective for removing the abrasive slurry components including the polishing particles remaining on the polishing cloth. The water-soluble nonionic compound does not function as a polisher during polishing, but functions to accelerate adsorption as it is adsorbed most rapidly on the polishing cloth (see FIG. 1). As shown in FIG. 1, the water-soluble nonionic compound 1, the water-soluble polymer particles having amino groups on the side chains 2, and the cerium oxide particles 3 are adsorbed in that order on the abrasive cloth, and the film to be polished 4 on the polishing substrate surface in contact therewith is polished efficiently at high speed, by the action of the water-soluble polymer particles having amino groups on the side chains. Thus, the cerium oxide particles 3 are held in the sandwiched structure during polishing.

On the other hand after polishing the water-soluble nonionic compound 1 remaining on the polishing cloth is dissolved and also all components present on the polishing cloth are wash away by action of the water-soluble nonionic compound 1 in the presence of a great amount of water or an aqueous solution 5, leading to reduction of polishing defect. Thus, addition of water or the aqueous solution 5 after polishing results in release of the water-soluble nonionic compound 1 from the polishing cloth and the film to be polished 4, separating the cerium oxide particle 3 held in the sandwich structure.

CMP abrasive slurries containing a water-soluble nonionic compound show a polishing defect of 90% or less of that of the CMP abrasive slurries containing no water-soluble nonionic compound. The polishing defect, which leads to deterioration in yield during device production, is preferably as low as possible.

The polishing method according to the present invention is characterized by polishing a film to be polished by pressing a substrate carrying the film to be polished against a polishing cloth placed on a polishing surface plate and moving the substrate and the polishing surface plate relatively to each other while supplying the CMP abrasive slurry into the space between the film to be polished and the polishing cloth under pressure. The insulation film to be polished is, for example, an inorganic insulation film such as silicon oxide insulation film or silicon nitride insulation film. The inorganic insulation film can be prepared, for example, by a low-pressure CVD method, a plasma CVD method, or the like. In preparation of the silicon oxide insulation film by the low-pressure CVD method, monosilane ($SiH_4$), trimethylsilane ($CH_3SiH$) or the like is used as the Si source, while oxygen ($O_2$), nitrous oxide ($N_2O$) or the like as the oxygen source. The film is obtained by carrying out the $SiH_4$—$O_2$ oxidation reaction at a low temperature of 400° C. or lower. It is heat-treated, as needed, after CVD at a temperature of 1,000° C. or lower. When phosphorus (P) is desirably doped for surface flattening by high-temperature reflow, use of a $SiH_4$—$O_2$—$PH_3$-based reaction gas is preferable.

The plasma CVD method is advantageous in that chemical reactions demanding high temperature under normal thermal equilibrium can be carried out at low temperature. The plasma can be generated by a capacity coupling method or an induction coupling method. The reaction gas is, for example, a $SiH_4$—$N_2O$ gas prepared from a Si source of $SiH_4$ and an oxygen source of $N_2O$ or a TEOS—$O_2$ gas prepared from a Si source of tetraethoxysilane (TEOS) (TEOS-plasma CVD method). The substrate temperature is preferably in the range of 250 to 400° C. and the reaction pressure in the range of 67 to 400 Pa. In this way, the silicon oxide insulation film, to which the CMP abrasive slurry according to the present invention is applied, may be doped with an element such as phosphorus or boron. Similarly, a silicon nitride insulation film is formed from a Si source of dichlorosilane ($SiH_2Cl_2$) and a nitrogen source of ammonia ($NH_3$) by the low-pressure CVD method. The film is formed by $SiH_2Cl_2$—$NH_3$ oxidation reaction at a high temperature of 900° C. In the plasma CVD method, $SiH_4$ is used as the reaction gas of Si source, and $SiH_4$—$NH_3$-based gas containing $NH_3$ as the reaction gas of nitrogen source. The substrate temperature is preferably 300° C. to 400° C.

The polishing machine for use is, for example, a common polishing machine having a holder grasping a semiconductor substrate and a polishing surface plate connected to a variable rotation-speed motor that carries a polishing cloth (pad) bonded thereto.

The polishing cloth is not particularly limited, and examples thereof include general nonwoven fabrics, expanded polyurethane moldings, porous fluoroplastics, and the like. It is desirable to carry out trench processing, to make the polishing cloth grasp the CMP abrasive slurry more effectively.

The polishing condition is also not particularly limited, but the rotational velocity of the polishing surface plate is preferably 200 $min^{-1}$ or less for prevention of separation of the semiconductor substrate, and the pressure applied to the semiconductor substrate is preferably 0.098 MPa (1 kg/$cm^2$) or less for prevention of scratching after polishing. During polishing, the CMP abrasive slurry is supplied continuously to the polishing cloth, for example, with a pump. The feed rate is not particularly limited, but preferably controlled to make the surface of the polishing cloth always covered with the CMP abrasive slurry.

The semiconductor substrate after polishing is preferably washed thoroughly with running water and the water droplets remaining on the semiconductor substrate removed for example with a spin drier before drying. After formation of the smoothened shallow trenches, aluminum wiring is formed on the silicon oxide insulation film layer, and a silicon oxide insulation film is formed once again between and on the wires by the method above, and the entire surface of the semiconductor substrate is smoothened by polishing with the CMP abrasive slurry for removal of the irregularity of the insulation film surface. Repetition of the steps above gives a semiconductor having a desired number of layers.

The polishing rate above is the amount of the decrease in film when the polishing substrate described above is polished by the polishing method described above, and generally a polishing depth per minute is used as the numerical value.

The high-speed CMP abrasive slurry for polishing insulation film according to the present invention has a polishing rate, as determined when the cerium oxide particle amount and the polishing condition are the same, of 1.2 times or more greater than that of the abrasive slurry containing no water-soluble polymer having amino groups on the side chains.

As the substrate having a raised region according to the present invention, favorably used is a semiconductor substrate, i.e., a substrate having a silicon oxide insulation film layer or a silicon nitride insulation film layer formed on a semiconductor substrate having circuit elements and wiring pattern formed or a semiconductor substrate having circuit elements formed.

By polishing such a silicon oxide insulation film layer formed on a semiconductor substrate with the CMP abrasive slurry, it is possible to eliminate the surface irregularity of the silicon oxide insulation film layer and smoothen the entire surface of the semiconductor substrate rapidly.

The polishing rate in the raised region, as used in the present invention, means the polishing rate when the raised region of the irregular surfaced substrate described is polished. The polishing rate is the amount of decrease in film thickness per minute in the raised region, when a substrate having iterativel level differences of raised line having a width of 100 µm and trench having a width of 100 µm is polished. The level difference is not particularly limited, but preferably in the range of 0.2 to 5 µm.

When the cerium oxide particle amount and the polishing condition are the same, the CMP abrasive slurry according to the present invention has a polishing rate in the raised region of 1.5 times or more greater than that of the abrasive slurries containing no water-soluble polymer having amino groups on the side chains.

The CMP abrasive slurry according to the present invention may be used as an alternative for abrasive slurries containing fumed silica as the principal component that are generally used as flattening abrasives slurries for semiconductors. The CMP abrasive slurry according to the present invention, which allows high-speed polishing of raised lines, than the abrasive slurries containing fumed silica as the principal component is superior in throughput and also economically favorable from the point of production cost.

The CMP abrasive slurry according to the present invention is applied favorably as an alternate for the abrasive slurries containing fumed silica as the principal component in the polishing process, the initial coarse level-difference eliminating step of which is performed by using the abrasive containing fumed silica as the principal component. The substrate to be polished is not particularly limited, if it is an insulation film substrate having level difference, but generally, a substrate in the insulation film structure such as shallow trench structure, ILD structure, or IMD structure.

In the case of polishing of a substrate in the shallow trench structure, the abrasive slurries containing cerium oxide particles, a dispersant, polyacrylic acid and pure water, which are described in Japanese Patent Nos. 3462052 and 3649279, are preferably used after polishing with the CMP abrasive slurry according to the present invention. In the case of an abrasive slurry containing cerium oxide particles, a dispersant, polyacrylic acid, and pure water because polishing on the silicon nitride insulation film with the abrasive slurry (autostop mechanism), it is preferable to use the abrasive slurry containing cerium oxide particles, a dispersant, polyacrylic acid and pure water, which has autostopping action, after polishing by using the CMP abrasive slurry according to the present invention in the initial coarse polishing step.

The film to be polished that is formed on the surface of a substrate to be polished with the CMP abrasive slurry according to the present invention is preferably an insulation film that contains at least $SiO_2$, SiOC, and BPSG films. The rate of insulation films such as silicon oxide insulation film and inorganic insulation films (e.g. glass film) formed on a wiring board having particular wiring is preferably 1% or more, with respect to the entire substrate area.

Electronic parts to be polished with the polishing method according to the present invention are preferably semiconductor electronic parts, more preferably semiconductor elements, but examples thereof include, in addition to the semiconductor elements above, inorganic conductive films such as of ITO; optical single crystals such as optical integrated circuits, optical switching elements and optical waveguides made of glass and a crystalline material, end face of optical fibers and scintillator; solid state laser single crystal, blue laser LED sapphire substrate, semiconductor single crystal such as of SiC, GaP, and GaAs; as well as glass plates for magnetic disk, magnetism head, and the like.

Examples of the electronic parts include devices having an insulation film such as semiconductor elements and multilayered wiring boards. Specifically, it may be used as a surface protection film (passivation film), a buffer coat film, an interlayer insulation film, or the like in semiconductor elements. Alternatively in multilayered wiring boards, it may be used favorably as an interlayer insulation film. More specifically, such semiconductor elements include individual semiconductors such as diode, transistor, compound semiconductor, thermistor, varistor, and thyristor; memory elements such as DRAM (dynamic-random-access-memory), SRAM (static-random-access-memory), EPROM (erasable-programmable-read-only memory), mask ROM (mask-read-only memory), EEPROM (electrical-erasable-programmable-read-only memory), and flash memory; theoretical circuit element such as microprocessor, DSP and ASIC; integrated circuit elements such as compound semiconductors represented by MMIC (monolithic-microwave integrated circuit); hybrid integrated circuits (hybrid ICs); photoelectric conversion element such as light-emitting diode and charge coupled device; and the like. Examples of the multilayered wiring boards include high-density wiring boards such as MCM and the like.

EXAMPLES (Preparation of Cerium Oxide Particles)

Two kg of cerium carbonate hydrate was placed in a platinum container and baked in air at 800° C. for 2 hours, to give approximately 1 kg of a yellow white powder. The crystalline phase of the powder was analyzed by X-ray diffraction method, to show that the powder was cerium oxide. The diameter of the baked powder particles was 30 to 100 μm. Observation of the baked powder particle surface under a scanning electron microscope showed the grain boundary of cerium oxide.

Measurement of the diameter of the cerium oxide primary particles surrounded by grain boundary showed that the median value of volume distribution was 190 nm and the maximum value 500 nm.

Then, 1 kg of the cerium oxide powder obtained was dry-pulverized in a jet mill. Observation of the pulverized particles under a scanning electron microscope showed that there were small particles similar in size to the primary grain diameter as well as large unpulverized particles having a diameter of 1 to 3 μm and unpulverized particle having a diameter of 0.5 to 1 μm.

(Preparation of Water-soluble Polymer)

The blending rates shown below are all expressed by weight.

Preparative Example 1

300 parts of deionized water was placed in a 1-liter flask and heated to 90° C. while agitated under nitrogen gas atmosphere; 1 part of a polymerization initiator (trade name: VA-061, manufactured by Wako Pure Chemical Industries Ltd.) dissolved in 80 parts of N,N-diethylaminoethyl acrylate and 20 parts of acryloylmorpholine was added into the flask over one hour. The mixture was then kept at 90° C. for 5 hours and cooled to 30° C. or lower, to give a solution of water-soluble polymer (I). The nonvolatile matter determined was 25 wt %.

A GPC column (W550, manufactured by Hitachi Chemical Co., Ltd.) was connected to a HPLC pump (L-7100, manufactured by Hitachi, Ltd.) equipped with a differential refractometer (L-3300, manufactured by Hitachi, Ltd.); the molecular weight of the water-soluble polymer (I) obtained was determined by using 0.3 M NaCl as the mobile phase, showing that the weight-average molecular weight of the water-soluble polymer (I) was 78,000 (as polyethylene glycol).

Preparative Example 2

A water-soluble polymer (II) solution was prepared in a similar manner to Preparative Example 1, except that 20 parts of acryloylmorpholine was replaced with 20 parts of N,N-diethylacrylamide. The nonvolatile matter determined was 25 wt %.

Molecular weight measurement similar to that in Preparative Example 1 showed that the weight-average molecular weight of the water-soluble polymer (II) was 58,000 (as polyethylene glycol).

Preparative Example 3

A water-soluble polymer (III) solution was prepared in a similar manner to Preparative Example 1, except that 80 parts of N,N-dimethylaminoethyl acrylate was replaced with 80 parts of N,N-dimethylaminopropyl methacrylate. The nonvolatile matter determined was 25 wt t.

Molecular weight measurement similar to that in Preparative Example 1 showed that the weight-average molecular weight of the water-soluble polymer (III) was 250,000 (as polyethylene glycol).

Preparative Example 4

A water-soluble polymer (IV) solution was prepared in a similar manner to Preparative Example 1, except that 80 parts of N,N-dimethylaminoethyl acrylate and 20 parts of acryloylmorpholine were replaced with 100 parts of N,N-dimethylaminopropylacrylamide. The nonvolatile matter determined was 25 wt %.

Molecular weight measurement similar to that in Preparative Example 1 showed that the weight-average molecular weight of the water-soluble polymer (IV) was 100,000 (as polyethylene glycol).

Preparative Example 5

A water-soluble polymer (V) solution was prepared in a similar manner to Preparative Example 1, except that 80 parts of N,N-dimethylaminoethyl acrylate was replaced with 80 parts of N,N-dimethylaminopropyl methacrylate. The nonvolatile matter determined was 25 wt W.

Molecular weight measurement similar to that in Preparative Example 1 showed that the weight-average molecular weight of the water-soluble polymer (V) was 74,000 (as polyethylene glycol).

Preparative Example 6

A water-soluble polymer (VI) solution was prepared in a similar manner to Preparative Example 1, except that 80 parts of N,N-dimethylaminoethyl acrylate and 20 parts of acryloylmorpholine were replaced with 95 parts of acryloylmorpholine and 5 parts of N,N-dimethylaminopropylacrylamide. The nonvolatile matter determined was 25 wt %.

Molecular weight measurement similar to that in Preparative Example 1 showed that the weight-average molecular weight of the water-soluble polymer (VI) was 280,000 (as polyethylene glycol).

Preparative Example 7

A water-soluble polymer (VII) solution was prepared in a similar manner to Preparative Example 1, except that 80 parts of N,N-dimethylaminoethyl acrylate and 20 parts of acryloylmorpholine were replaced with 95 parts of N,N-dimethylacrylamide and 5 parts of N,N-dimethylaminopropyl methacrylate. The nonvolatile matter determined was 25 wt %.

Molecular weight measurement similar to that in Preparative Example 1 showed that the weight-average molecular weight of the water-soluble polymer (VII) was 450,000 (as polyethylene glycol).

Preparative Example 8

A water-soluble polymer (VIII) solution was prepared in a similar manner to Preparative Example 1, except that 80 parts of N,N-dimethylaminoethyl acrylate and 20 parts of acryloylmorpholine were replaced with 95 parts of N,N-dimethylacrylamide and 5 parts of N,N-dimethylaminoethyl acrylate. The nonvolatile matter determined was 25 wt %.

Molecular weight measurement similar to that in Preparative Example 1 showed that the weight-average molecular weight of the water-soluble polymer (VIII) was 180,000 (as polyethylene glycol).

Preparative Example 9

A water-soluble polymer (IX) solution was prepared in a similar manner to Preparative Example 1, except that 80 parts of N,N-dimethylaminoethyl acrylate and 20 parts of acryloylmorpholine were replaced with 95 parts of N,N-dimethylacrylamide and 5 parts of N,N-dimethylaminopropylacrylamide. The nonvolatile matter determined was 25 wt %.

Molecular weight measurement similar to that in Preparative Example 1 showed that the weight-average molecular weight of the water-soluble polymer (IX) was 380,000 (as polyethylene glycol).

(Preparation of Abrasive Slurry)

Example 1

One kg of the cerium oxide particles prepared above, 23 g of an aqueous ammonium polyacrylate salt solution (weight-average molecular weight: 9000, 40 wt %-aqueous solution) and 8,977 g of deionized water were mixed, and the mixture was dispersed while agitated under ultrasonication for 10 minutes. The slurry obtained was filtered through a 1-micron filter, and deionized water was added to the filtrate, to give a cerium oxide slurry at a solid matter concentration of 5 wt %. The pH of the cerium oxide slurry was 8.3. The median value of the diameter of the slurry particles, as determined by diluting the slurry to a suitable concentration and measuring the diluted slurry by using a laser-scattering particle size distribution analyzer (Master Sizer Microplus, manufactured by Malvern) at a refractive index of 1.93, was 190 nm.

600 g of the cerium oxide slurry above (solid matter: 5 wt %), 3.6 g of the water-soluble polymer (I) solution obtained in Preparative Example 1 and 2,396.4 g of deionized water were mixed, to give an abrasive slurry (A) (solid matter: 1 wt %). The pH of the abrasive slurry (A) was 8.1.

The median value of the diameter of the particles in abrasive slurry (A), as determined by diluting the slurry to a suitable concentration and measuring the diluted slurry by using a laser-scattering particle size distribution analyzer (Master Sizer Microplus, manufactured by Malvern) at a refractive index of 1.93, was 190 nm.

(Polishing of Insulation Film Layer)

A 864 wafer (diameter φ: 200 mm) manufactured by SEMATECH was used as a wafer carrying no pattern but carrying a P-TEOS film of 1 μm in thickness (blanket wafer) and also as a test wafer for evaluation of CMP test carrying a pattern in a shallow trench structure. The depth of the trench was 500 nm; the thickness of the silicon nitride film formed in the active area by LP-CVD method was 150 nm; and the thickness of the silicon oxide film formed on the entire wafer by TEOS-plasma CVD method was 600 nm.

In a polishing machine (Mirra, manufactured by Applied Materials), each wafer was mounted on a holder having an adsorption pad for fixing a substrate for adsorbing a substrate, and alternatively, a porous urethane resin polishing pad IC-1000 (K trench) prepared by Rodale was mounted on a polishing surface plate having a diameter φ of 480 mm. The holder was mounted on the pad with its insulation film surface facing downward, and processing loads respectively of 3.3, 4.4, and 3.3 psi were applied to the membrane, the retainer ring, and the inner tube.

Each wafer was polished for 40 seconds, while the abrasive slurry (A) was fed onto the surface plate dropwise at a rate of 200 mL/minute and the surface plate and the wafer were rotated respectively at rates of 93 $min^{-1}$ and 87 $min^{-1}$. The wafer after polishing was immersed in dilute 0.5% hydrofluoric acid for 1 minute, washed with running pure water and rubbing with a PVA brush, and dried.

Then, the thicknesses of the residual blanket wafer and the residual insulation film in the raised region were determined by using a light-interference film thickness meter (RE-3000, manufactured by Dainippon Screen Mfg., Co., Ltd.). The polishing depth for 40 seconds was determined from the difference between the initial film thickness and the residual film thickness.

Example 2

An abrasive slurry (B) (solid matter: 1 wt %) was prepared in a similar manner to Example 1, except that the water-soluble polymer (I) solution was replaced with the water-soluble polymer (II) solution obtained in Preparative Example 2. The pH of the abrasive slurry (B) was 8.3. The median diameter of the particles in the abrasive slurry (B), as determined in a similar manner to Example 1, was 190 nm.

The insulation film layer was polished in a similar manner to Example 1, while the abrasive slurry (A) was replaced with the abrasive slurry (B), to give the results shown in Table 1.

Example 3

An abrasive slurry (C) (solid matter: 1 wt %) was prepared in a similar manner to Example 1, except that the water-soluble polymer (I) solution was replaced with the water-soluble polymer (III) solution obtained in Preparative Example 3. The pH of the abrasive slurry (C) was 8.2. The median diameter of the particles in the abrasive slurry (C), as determined in a similar manner to Example 1, was 190 nm.

The insulation film layer was polished in a similar manner to Example 1, while the abrasive slurry (A) was replaced with the abrasive slurry (C), to give the results shown in Table 1.

Example 4

An abrasive slurry (D) (solid matter: 1 wt %) was prepared in a similar manner to Example 1, except that 3.6 g of the water-soluble polymer (I) solution and 2,396.4 g of deionized water were replaced with 1.2 g of the water-soluble polymer (IV) solution obtained in Preparative Example 4 and 2,398.8 g of deionized water. The pH of the abrasive slurry (D) was 8.3. The median diameter of the particles in the abrasive slurry (D), as determined in a similar manner to Example 1, was 190 nm.

The insulation film layer was polished in a similar manner to Example 1, except that the abrasive slurry (A) was replaced with the abrasive slurry (D), to give the results shown in Table 1.

Example 5

An abrasive slurry (E) (solid matter: 1 wt %) was prepared in a similar manner to Example 1, except that 3.6 g of the water-soluble polymer (I) solution and 2,396.4 g of deionized water were replaced with 12 g of the water-soluble polymer (V) solution obtained in Preparative Example 5 and 2,388 g of deionized water. The pH of the abrasive slurry (E) was 8.4. The median diameter of the particles in the abrasive slurry (E), as determined in a similar manner to Example 1, was 190 nm.

The insulation film layer was polished in a similar manner to Example 1, except that the abrasive slurry (A) was replaced with the abrasive slurry (E), to give the results shown in Table 1.

Example 6

An abrasive slurry (F) (solid matter: 1 wt %) was prepared in a similar manner to Example 1, except that the water-soluble polymer (I) solution was replaced with the water-soluble polymer (VI) solution obtained in Preparative Example 6. The pH of the abrasive slurry (F) was 8.4. The median diameter of the particles in the abrasive slurry (F), as determined in a similar manner to Example 1, was 190 nm.

The insulation film layer was polished in a similar manner to Example 1, while the abrasive slurry (A) was replaced with the abrasive slurry (F), to give the results shown in Table 1.

Example 7

An abrasive slurry (G) (solid matter: 1 wt) was prepared in a similar manner to Example 1, except that 3.6 g of the water-soluble polymer (I) solution and 2,396.4 g of deionized water were replaced with 6.0 g of the water-soluble polymer (VII) solution obtained in Preparative Example 7 and 2,394 g of deionized water. The pH of the abrasive slurry (G) was 8.3. The median diameter of the particles in the abrasive slurry (G), as determined in a similar manner to Example 1, was 190 nm.

The insulation film layer was polished in a similar manner to Example 1, while the abrasive slurry (A) was replaced with the abrasive slurry (G), to give the results shown in Table 1.

Example 8

An abrasive slurry (H) (solid matter: 1 wt %) was prepared in a similar manner to Example 1, except that the water-soluble polymer (I) solution was replaced with the water-soluble polymer (VIII) solution obtained in Preparative Example 8. The pH of the abrasive slurry (H) was 8.5. The median diameter of the particles in the abrasive slurry (H), as determined in a similar manner to Example 1, was 190 nm.

The insulation film layer was polished in a similar manner to Example 1, while the abrasive slurry (A) was replaced with the abrasive slurry (H), to give the results shown in Table 1.

Example 9

An abrasive slurry (I) (solid matter: 1 wt %) was prepared in a similar manner to Example 1, except that the water-soluble polymer (I) solution was replaced with the water-soluble polymer (IX) solution obtained in Preparative Example 9. The pH of the abrasive slurry (I) was 8.4. The median diameter of the particles in the abrasive slurry (I), as determined in a similar manner to Example 1, was 190 nm.

The insulation film layer was polished in a similar manner to Example 1, while the abrasive slurry (A) was replaced with the abrasive slurry (I), to give the results shown in Table 1.

Comparative Example 1

An abrasive slurry (J) (solid matter: 1 wt %) was prepared in a similar manner to Example 1, except that 3.6 g of the water-soluble polymer (I) solution and 2,396.4 g of deionized water were replaced with 2,400 g of deionized water. The pH of the abrasive slurry (J) was 8.3. The median diameter of the particles in the abrasive slurry (J), as determined in a similar manner to Example 1, was 190 nm.

The insulation film layer was polished in a similar manner to Example 1, while the abrasive slurry (A) was replaced with the abrasive slurry (J), to give the results shown in Table 1.

Comparative Example 2

An abrasive slurry (K) (solid matter: 1 wt %) was prepared in a similar manner to Example 1, except that 3.6 g of the water-soluble polymer (I) solution and 2,396.4 g of deionized water were replaced with 45 g of aqueous ammonium polyacrylate solution (weight-average molecular weight: 9000, 40 wt % aqueous solution) and 2,355 g of deionized water. The pH of the abrasive slurry (K) was 7.0. The median diameter of the particles in the abrasive slurry (K), as determined in a similar manner to Example 1, was 190 nm.

The insulation film layer was polished in a similar manner to Example 1, while the abrasive slurry (A) was replaced with the abrasive slurry (K), to give the results shown in Table 1.

TABLE 1

|  | Example | | | | | | | | | Comparative Example | |
| --- | --- | --- | --- | --- | --- | --- | --- | --- | --- | --- | --- |
|  | 1 | 2 | 3 | 4 | 5 | 6 | 7 | 8 | 9 | 1 | 2 |
| Kind of abrasive slurry | (A) | (B) | (C) | (D) | (E) | (F) | (G) | (H) | (I) | (J) | (K) |
| Blending rate of cerium oxide slurry (g) | 600 | 600 | 600 | 600 | 600 | 600 | 600 | 600 | 600 | 600 | 600 |
| Water-soluble polymer  Kind | (I) | (II) | (III) | (IV) | (V) | (VI) | (VII) | (VIII) | (IX) | None | Ammonium polyacrylate |
| Blending rate of solution (g) | 3.6 | 3.6 | 3.6 | 1.2 | 12 | 3.6 | 6 | 3.6 | 3.6 | 0 | 45 |
| Deionized water (g) | 2396.4 | 2396.4 | 2396.4 | 2398.8 | 2388 | 2396.4 | 2394 | 2396.4 | 2396.4 | 2400 | 2355 |
| pH of abrasive slurry | 8.1 | 8.3 | 8.2 | 8.3 | 8.4 | 8.4 | 8.3 | 8.5 | 8.4 | 8.3 | 7.0 |
| Average diameter of cerium oxide (nm) | 190 | 190 | 190 | 190 | 190 | 190 | 190 | 190 | 190 | 190 | 190.0 |
| Blanket wafer polishing depth (nm/min) | 420 | 375 | 366 | 480 | 372 | 473 | 405 | 480 | 515 | 164 | 186 |
| Polishing depth of raised-region pattern after 40 seconds (nm) | 290 | 264 | 327 | 377 | 377 | 366 | 325 | 338 | 377 | 186 | 188 |
| Uniformity of polishing rate distribution (s %) | 5.2 | 4.8 | 5.5 | 6.2 | 3.8 | 6.2 | 4.4 | 4.6 | 5.2 | 10.5 | 12.3 |

As obvious from the results shown in Table 1, in Comparative Example 1 where the abrasive slurry (J) containing no water-soluble polymer was used and also in Comparative Example 2 where the abrasive slurry (K) containing ammonium polyacrylate was used, the polishing depths after polishing for 40 seconds were small respectively at 109 and 124 nm, suggesting that the abrasive slurries were not compatible with high-speed operation; it was also not possible to polish flatly, as shown by the large level differences respectively of 412 and 414 nm; and the period needed to expose the silicon nitride film is longer, respectively at 120 and 180 seconds. In contrast in Examples 1 to 9 where abrasive slurries (A) to (K) containing the water-soluble polymer having amino groups on the side chains according to the present invention were used, the polishing depths after polishing for 40 seconds were longer at 244 to 343 nm; the film was polished at a rate twice or more higher than that in Comparative Examples 1 and 2; the film was polished flatly to a small level difference of 223 to 336; and the periods needed to expose the silicon nitride film were shorter at 70 to 105 seconds.

Example 10

One kg of the cerium oxide particles prepared above, 23 g of an aqueous ammonium polyacrylate salt solution (weight-average molecular weight: 9,000, 40 wt % aqueous solution) and 8,977 g of deionized water were mixed, and the mixture was dispersed while agitated under ultrasonication for 10 minutes. The slurry obtained was filtered through a 1-micron filter, and deionized water was added to the filtrate, to give a cerium oxide slurry at a solid matter concentration of 5 wt %. The pH of the cerium oxide slurry was 8.3. The median value of the diameter of the slurry particles, as determined by diluting the slurry to a suitable concentration and measuring the diluted slurry by using a laser-scattering particle size distribution analyzer (Master Sizer Microplus, manufactured by Malvern) at a refractive index of 1.93, was 190 nm.

300 g of the cerium oxide slurry (solid matter: 5 wt %), 3.6 g of the water-soluble polymer (VII) solution used in Preparative Example 7, 1.5 g of polyethylene glycol (weight-average molecular weight: 20,000) and 2,694.9 g of deionized water were mixed, to give an abrasive slurry (L) (solid matter: 0.5 wt %). The pH of the abrasive slurry (L) was 8.1.

The median value of the diameter of the particles in abrasive slurry (L), as determined by diluting the slurry to a suitable concentration and measuring the diluted slurry by using a laser-scattering particle size distribution analyzer (Master Sizer Microplus, manufactured by Malvern) at a refractive index of 1.93, was 190 nm.

(Polishing of Insulation Film Layer)

A 864 wafer (diameter $\phi$: 200 mm) manufactured by SEMATECH was used as a wafer carrying no pattern but carrying a P-TEOS film of 1 µm in thickness (blanket wafer) and as a test wafer for evaluation of CMP test carrying a pattern in a shallow trench structure. The depth of the trench was 500 nm; the thickness of the silicon nitride film formed in the active area by LP-CVD method was 150 nm; and the thickness of the silicon oxide film formed on the entire wafer by TEOS-plasma CVD method was 600 nm.

In a polishing machine (Mirra, manufactured by Applied Materials), each wafer was mounted on a holder having an adsorption pad for adsorbing and holding a substrate for adsorbing a substrate, and alternatively, a porous urethane resin polishing pad IC-1000 (K trench) prepared by Rodale was mounted on a polishing surface plate having a diameter $\phi$ of 480 mm. The holder was mounted on the pad with its insulation film surface facing downward, and processing loads respectively of 3.3, 4.4, and 3.3 psi were applied to the membrane, the retainer ring and the inner tube.

Each wafer was polished for 40 seconds, while the abrasive slurry (L) was fed onto the surface plate dropwise at a rate of 200 mL/minute and the surface plate and the wafer were rotated respectively at rates of 93 $min^{-1}$ and 87 $min^{-1}$. The wafer after polishing was immersed in dilute 0.5% hydrofluoric acid for 1 minute, washed with running pure water and rubbing with a PVA brush, and dried.

Then, the thicknesses of the residual blanket wafer and the residual insulation film in the raised region were determined by using a light-interference film thickness meter (RE-3000, manufactured by Dainippon Screen Mfg., Co., Ltd.). The polishing depth for 40 seconds was determined from the difference between the initial film thickness and the residual film thickness.

Separately, the number of the polishing scratches having a size of 0.2 µm on the P-TEOS film after polishing was determined by using "Surfscan6220" manufactured by KLA Tencor and "LA-2000" manufactured by Olympus. These results are summarized in Table 2.

Reference Example 1

An abrasive slurry (M) (solid matter: 0.5 wt %) was prepared in a similar manner to Example 10, except that polyethylene glycol was not used and 2,696.4 g of deionized water was used. The pH of the abrasive slurry (M) was 8.1. The median diameter of the particles in the abrasive slurry (M), as determined in a similar manner to Example 10, was 190 nm.

The insulation film layer was polished in a similar manner to Example 10, while the abrasive slurry (L) was replaced with the abrasive slurry (M), to give the results shown in Table 2.

Example 11

An abrasive slurry (N) (solid matter: 0.5 wt %) was prepared in a similar manner to Example 10, except that the water-soluble polymer (VII) solution was replaced with the water-soluble polymer (II) solution obtained in Preparative Example 2. The pH of the abrasive slurry (N) was 8.3. The median diameter of the particles in the abrasive slurry (N), as determined in a similar manner to Example 10, was 190 nm.

The insulation film layer was polished in a similar manner to Example 10, while the abrasive slurry (L) was replaced with the abrasive slurry (N), to give the results shown in Table 2.

Example 12

An abrasive slurry (O) (solid matter: 0.5 wt %) was prepared in a similar manner to Example 10, except that the water-soluble polymer (VII) solution was replaced with the water-soluble polymer (III) solution obtained in Preparative Example 3. The pH of the abrasive slurry (O) was 8.2. The median diameter of the particles in the abrasive slurry (O), as determined in a similar manner to Example 10, was 190 nm.

The insulation film layer was polished in a similar manner to Example 10, while the abrasive slurry (L) was replaced with the abrasive slurry (O), to give the results shown in Table 2.

Example 13

An abrasive slurry (P) (solid matter: 0.5 wt %) was prepared in a similar manner to Example 10, except that the water-soluble polymer (VII) solution was replaced with 2.4 g of the water-soluble polymer (IX) solution obtained in Preparative Example 9 and the polyethylene glycol with 3.0 g of polyethylene glycol monostearate, and the deionized water with 2,398.8 g of deionized water. The pH of the abrasive slurry (P) was 8.3. The median diameter of the particles in the abrasive slurry (P), as determined in a similar manner to Example 10, was 190 nm.

The insulation film layer was polished in a similar manner to Example 10, while the abrasive slurry (L) was replaced with the abrasive slurry (P), to give the results shown in Table 2.

Example 14

An abrasive slurry (O) (solid matter: 0.5 wt %) was prepared in a similar manner to Example 10, except that 4.8 g of the water-soluble polymer (VII) solution, 4.8 g of 5-decyne-2,4,7,9-tetramethyl-5-decyne-4,7-diol replacing polyethylene glycol, and 2,690.4 g of deionized water were used. The pH of the abrasive slurry (O) was 8.4. The median diameter of the particles in the abrasive slurry (O), as determined in a similar manner to Example 10, was 190 nm.

The insulation film layer was polished in a similar manner to Example 10, while the abrasive slurry (L) was replaced with the abrasive slurry (O), to give the results shown in Table 2.

Example 15

An abrasive slurry (R) (solid matter: 0.5 wt %) was prepared in a similar manner to Example 10, except that the water-soluble polymer (VII) solution was replaced with 3.6 g of the water-soluble polymer (II) solution obtained in Preparative Example 2, the polyethylene glycol with 3.6 g of polyoxyethylene sorbitan tristearate, and the deionized water was used in an amount of 2692.8 g. The pH of the abrasive slurry (R) was 8.4. The median diameter of the particles in the abrasive slurry (R), as determined in a similar manner to Example 10, was 190 nm.

The insulation film layer was polished in a similar manner to Example 10, while the abrasive slurry (L) was replaced with the abrasive slurry (R), to give the results shown in Table 2.

Example 16

An abrasive slurry (S) (solid matter: 0.5 wt %) was prepared in a similar manner to Example 10, except that the water-soluble polymer (VII) solution was replaced with 4.8 g of the water-soluble polymer (III) solution obtained in Preparative Example 3, the polyethylene glycol with 3.6 g of polyoxyethylene sorbitan tristearate, and the deionized water was used in an amount of 2,691.6 g. The pH of the abrasive slurry (S) was 8.3. The median diameter of the particles in the abrasive slurry (S), as determined in a similar manner to Example 10, was 190 nm.

The insulation film layer was polished in a similar manner to Example 10, while the abrasive slurry (L) was replaced with the abrasive slurry (S), to give the results shown in Table 2.

Example 17

An abrasive slurry (T) (solid matter: 0.5 wt %) was prepared in a similar manner to Example 10, except that the water-soluble polymer (VII) solution was replaced with 6.0 g the water-soluble polymer (IX) solution obtained in Preparative Example 9. The pH of the abrasive slurry (T) was 8.5. The median diameter of the particles in the abrasive slurry (T), as determined in a similar manner to Example 10, was 190 nm.

The insulation film layer was polished in a similar manner to Example 10, while the abrasive slurry (L) was replaced with the abrasive slurry (T), to give the results shown in Table 2.

Comparative Example 3

1 kg of the cerium oxide particles prepared above, 23 g of an aqueous ammonium polyacrylate salt solution (weight-average molecular weight: 9,000, 40 wt % aqueous solution) and 8,977 g of deionized water were mixed, and the mixture was dispersed while agitated under ultrasonication for 10 minutes. The slurry obtained was filtered through a 1-micron filter, and deionized water was added to the filtrate, to give a cerium oxide slurry at a solid matter concentration of 5 wt %. The pH of the cerium oxide slurry was 8.3.

300 g of the cerium oxide slurry (solid matter: 5 wt %) and 2,700 g of deionized water were mixed, to give an abrasive slurry (U) (solid matter: 0.5 wt %). The pH of the abrasive slurry (U) was 8.3. The median diameter of the particles in the abrasive slurry (U), as determined in a similar manner to Example 10, was 190 nm.

The insulation film layer was polished in a similar manner to Example 10, while the abrasive slurry (L) was replaced with the abrasive slurry (U), to give the results shown in Table 2.

Comparative Example 4

300 g of the cerium oxide slurry obtained in Comparative Example 3 (solid matter: 5 wt t), 45 g of an aqueous ammonium polyacrylate solution (40 wt % aqueous solution) and 2,655 g of deionized water were mixed, to give a cerium oxide abrasive slurry (V) (solid matter: 0.5 wt %). The pH of the abrasive slurry (V) was 7.0. The median diameter of the particles in the abrasive slurry (V), as determined in a similar manner to Example 10, was 190 nm.

The insulation film layer was polished in a similar manner to Example 10, while the abrasive slurry (L) was replaced with the abrasive slurry (V), to give the results shown in Table 2.

TABLE 2

| | Example | | | | | | | | Comparative Example | | Reference Example |
|---|---|---|---|---|---|---|---|---|---|---|---|
| | 10 | 11 | 12 | 13 | 14 | 15 | 16 | 17 | 3 | 4 | 1 |
| Kind of abrasive slurry | (L) | (N) | (O) | (P) | (Q) | (R) | (S) | (T) | (U) | (V) | (M) |
| Blending rate of cerium oxide slurry (g) | 300 | 300 | 300 | 300 | 300 | 300 | 300 | 300 | 300 | 300 | 300 |
| Water-soluble polymer Kind | VII | II | III | IX | VII | II | III | IX | None | (Ammonium polyacrylate) | VII |
| Blending rate of solution (g) | 3.6 | 3.6 | 3.6 | 2.4 | 4.8 | 3.6 | 4.8 | 3.6 | 0 | 45 | 3.6 |
| Nonionic compound Kind | Polyethylene glycol | Polyethylene glycol | Polyethylene glycol | Polyethylene glycol monostearate | 5-decyne-2,4,7,9-tetramethyl-5-decyne-4,7-diol | polyoxy-ethylene sorbitan tristearate | Polyoxy-ethylene sorbitan tristearate | Polyethylene glycol | None | None | None |
| Blending rate (g) | 1.5 | 1.5 | 1.5 | 3 | 4.8 | 3.6 | 3.6 | 1.5 | 0 | 0 | 0 |
| Deionized water (g) | 2694.9 | 2694.9 | 2694.9 | 2398.8 | 2690.4 | 2692.8 | 2691.6 | 2694.9 | 2700 | 2655 | 2696.4 |
| pH of abrasive slurry | 8.1 | 8.3 | 8.2 | 8.3 | 8.4 | 8.4 | 8.3 | 8.5 | 8.3 | 7 | 8.1 |
| Average diameter of cerium oxide (nm) | 190 | 190 | 190 | 190 | 190 | 190 | 190 | 190 | 190 | 190 | 190 |
| Blanket wafer polishing depth (nm/mm) | 730 | 590 | 770 | 850 | 620 | 710 | 830 | 620 | 290 | 240 | 750 |
| Polishing depth in the raised pattern region after 40 seconds (nm) | 322 | 244 | 280 | 343 | 310 | 299 | 273 | 280 | 124 | 109 | 325 |
| Uniformity of polishing rate distribution (s %) | 2.8 | 3.3 | 2.2 | 3.0 | 2.9 | 2.9 | 3.2 | 3.5 | 14.3 | 15.2 | 5.2 |
| Number of polishing defects | 25 | 80 | 30 | 55 | 80 | 95 | 100 | 70 | 40 | 30 | 1250 |

As obvious from the results shown in Table 2, when the abrasive slurries in Comparative Examples 3 and 4 were used, the polishing rate was low; the polishing depths after polishing for 40 seconds were respectively 109 and 124 nm; and the polishing rate of the P-TEOS blanket film was also low respectively at 240 to 290 nm/min.

In contrast, as shown in Table 2, when the abrasive slurries according to the present invention in Examples 10 to 17 were used, the polishing rates were twice or more higher than those obtained in Comparative Example 3 and 4, as the polishing depths after polishing for 40 seconds of 244 to 343 nm indicate.

It is also obvious that the polishing rates of the P-TEOS blanket film were also higher at 590 to 850 nm/min and that the number of the defects on P-TEOS was reduced to a value of 90% or less of that obtained in Comparative Example 1.

What is claimed is:

1. A CMP abrasive slurry for polishing insulation film, comprising cerium oxide particles, a dispersant, a water-soluble polymer having amino groups on the side chains, and water,
wherein the water-soluble polymer having amino groups on the side chains is a polymer prepared by polymerization of polymerizable compounds consisting of at least one compound selected from the group consisting of polymerizable amino compounds represented by the following General Formula (I):

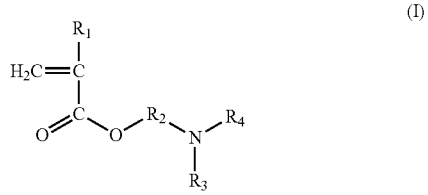

(in Formula (I), $R_1$ represents a hydrogen atom, a lower alkyl group, a phenyl group, a benzyl group, a halogen-substituted lower alkyl group, or a cyano group; $R_2$ represents a $C_1$-$C_{18}$ alkylene group; $R_3$ represents a hydrogen atom or a $C_1$-$C_{18}$ alkyl group; and $R_4$ represents a $C_1$-$C_{18}$ alkyl group), and polymerizable amino compounds represented by the following General Formula (II):

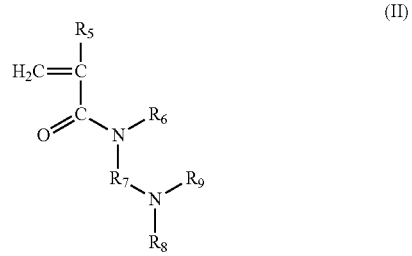

(in Formula (II), $R_5$ represents a hydrogen atom, a lower alkyl group, a phenyl group, a benzyl group, a halogen-substituted lower alkyl group, or a cyano group; $R_6$ represents a hydrogen atom or a $C_1$-$C_{18}$ alkyl group; $R_7$ represents a $C_1$-$C_{18}$ alkylene group; $R_8$ represents a hydrogen atom or a $C_1$-$C_{18}$ alkyl group; and $R_9$ represents a $C_1$-$C_{18}$ alkyl group).

2. The CMP abrasive slurry for polishing insulation film according to claim 1, wherein the CMP abrasive slurry has a polishing rate, as determined by using the same amount of cerium oxide particles contained in the CMP abrasive slurry for polishing the insulation film under the same polishing condition, of 1.2 times or more higher than that of another abrasive slurry, that is the same as said CMP abrasive slurry except that the another abrasive slurry does not contain a water-soluble polymer having amino groups on the side chains.

3. The CMP abrasive slurry for polishing insulation film according to claim 1, wherein the addition amount of the water-soluble polymer having amino groups on the side chains is 0.00001 wt part or more and 1 wt part or less with respect to 100 wt parts of the abrasive slurry.

4. The CMP abrasive slurry for polishing insulation film according to claim 1, further containing a water-soluble nonionic compound.

5. The CMP abrasive slurry for polishing insulation film according to claim 4, wherein the addition amount of the water-soluble nonionic compound is 0.00001 wt part or more and 1 wt part or less with respect to 100 wt parts of the abrasive slurry.

6. The CMP abrasive slurry for polishing insulation film according to claim 1, wherein the average diameter of the cerium oxide particles is 80 nm to 1,000 nm and the addition amount of the cerium oxide particles is 0.1 wt part or more and 15 wt parts or less with respect to 100 wt parts of the abrasive slurry.

7. The CMP abrasive slurry for polishing insulation film according to claim 1, wherein a cerium oxide slurry containing the cerium oxide particles, the dispersant and water (liquid A) and a supplementary solution containing the water-soluble polymer having amino groups on the side chains and water (liquid B) are supplied after having been mixed.

8. The CMP abrasive slurry for polishing insulation film according to claim 4, wherein a cerium oxide slurry containing the cerium oxide particles, the dispersant and water (liquid A) and a supplementary solution containing the water-soluble polymer having amino groups on the side chains, water and an aqueous nonionic compound (liquid C) are supplied after having been mixed.

9. The CMP abrasive slurry for polishing insulation film according to claim 1, wherein the cerium oxide particles and the water-soluble polymer having amino groups on the side chains are adsorbed on the polishing cloth and the uniformity of polishing rate distribution is 0.1% to 10% because of the action of the cerium oxide particles on the film to be polished.

10. The CMP abrasive slurry for polishing insulation film according to claim 4, wherein the number of the polishing defects remaining on the polishing substrate can be reduced to 90% or less by washing off the cerium oxide particles adsorbed on the polishing cloth after polishing with water or an aqueous solution.

11. The CMP abrasive slurry for polishing insulation film according to claim 1, wherein the abrasive slurry can be used as an alternative for a flattening abrasive slurry containing fumed silica as the principal component.

12. The CMP abrasive slurry for polishing insulation film according to claim 1, wherein said at least one compound consists of at least one compound selected from each of the polymerizable amino compounds represented by the General Formula (I) and the polymerizable amino compounds represented by the General Formula (II).

13. The CMP abrasive slurry for polishing insulation film according to claim 1, wherein said at least one compound consists of at least one compound selected from the group consisting of N,N-disubstituted amino compounds represented by the General Formula (I) and General Formula (II).

14. The CMP abrasive slurry for polishing insulation film according to claim 13, wherein said at least one compound consists of at least one compound selected from the group consisting of N,N-dimethylaminoethyl acrylate, N,N-dimethylaminopropyl methacrylate and N,N-dimethylaminopropyl methacrylamide.

15. The CMP abrasive slurry for polishing insulation film according to claim 1, wherein said water-soluble polymer has a weight-average molecular weight of at least 500.

16. The CMP abrasive slurry for polishing insulation film according to claim 1, wherein the slurry has a pH of 4 or more and 10 or less.

17. The CMP abrasive slurry for polishing insulation film according to claim 1, wherein the water-soluble polymer having amino groups on the side chains consists of said polymer prepared by the polymerization of the polymerizable compounds.

18. The CMP abrasive slurry for polishing insulation film according to claim 1, wherein the water-soluble polymer included in the slurry is a material in addition to the dispersant.

19. A method of polishing substrate, characterized by polishing a film to be polished by pressing a substrate carrying the film to be polished against a polishing cloth on a polishing surface plate and moving the substrate and the polishing surface plate relatively to each other while supplying the CMP abrasive slurry for polishing insulation film according to claim 1 into the space between the film to be polished and the polishing cloth under pressure.

20. A CMP abrasive slurry for polishing insulation film comprising cerium oxide particles, a dispersant, a water-soluble polymer having amino groups on the side chains, and water, wherein the water-soluble polymer having amino groups on the side chains is a polymer prepared by polymerization of compounds comprising:

at least one compound represented by the following General Formula (III):

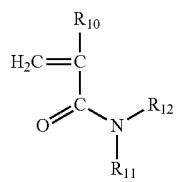

(III)

(in Formula (III), $R_{10}$ represents a hydrogen atom, a lower alkyl group, a phenyl group, a benzyl group, a halogen-substituted lower alkyl group, or a cyano group; $R_{11}$ and $R_{12}$ each represent a hydrogen atom, a $C_1$-$C_{18}$ alkyl group, a lower hydroxyalkylene group, or an acyl group; and $R_{11}$ and $R_{12}$ may bind to each other, forming a morpholino, thiomorpholino, pyrrolidino, or piperidino group), and at least one compound selected from the group consisting of polymerizable amino compounds represented by the following General Formula (I):

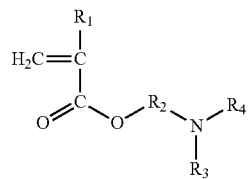

(I)

(in Formula (I), $R_1$ represents a hydrogen atom, a lower alkyl group, a phenyl group, a benzyl group, a halogen-substituted lower alkyl group, or a cyano group; $R_2$ represents a $C_1$-$C_{18}$ alkylene group; $R_3$ represents a hydrogen atom or a $C_3$-$C_{18}$ alkyl group; and $R_4$ represents a $C_1$-$C_{18}$ alkyl group), polymerizable amino compounds represented by the following General Formula (II):

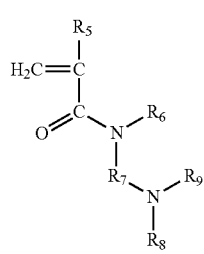

(II)

(in Formula (II), $R_5$ represents a hydrogen atom, a lower alkyl group, a phenyl group, a benzyl group, a halogen-substituted lower alkyl group, or a cyano group; $R_6$ represents a hydrogen atom or a $C_1$-$C_{18}$ alkyl group; $R_7$ represents a $C_1$-$C_{18}$ alkylene group; $R_8$ represents a hydrogen atom or a $C_2$-$C_{18}$ alkyl group; and $R_9$ represents a $C_1$-$C_{18}$ alkyl group), N,N-dimethylaminoethyl acrylate, N,N-diethylaminoethyl acrylate, N,N-dimethylaminopropyl acrylate, N,N-diethylaminopropyl acrylate, N,N-dimethylaminopropyl methacrylate, N,N-diethylaminopropyl methacrylate, and N,N-dimethylaminopropyl methacrylamide, wherein the water-soluble polymer having amino groups on the side chains is a polymer prepared by polymerization of compounds consisting of (a) said at least one compound represented by the General Formula (III), and (b) said at least one compound selected from the group consisting of polymerizable amino compounds represented by the General Formula (I), polymerizable amino compounds represented by the General Formula (II), N,N-dimethylaminoethyl acrylate, N,N-diethylaminoethyl acrylate, N,N-dimethylaminopropyl acrylate, N,N-diethylaminopropyl acrylate, N,N-dimethylaminopropyl methacrylate, N,N-diethylaminopropyl methacrylate, and N,N-dimethylaminopropyl methacrylamide.

21. The CMP abrasive slurry for polishing insulation film according to claim 20, wherein the water-soluble polymer included in the slurry is a material in addition to the dispersant.

22. The CMP abrasive slurry for polishing insulation film according to claim 20, wherein the CMP abrasive slurry has a polishing rate, as determined by using the same amount of cerium oxide particles contained in the CMP abrasive slurry for polishing the insulation film under the same polishing condition, of 1.2 times or more higher than that of another abrasive slurry, that is the same as said CMP abrasive slurry except that the another abrasive slurry does not contain a water-soluble polymer having amino groups on the side chains.

23. The CMP abrasive slurry for polishing insulation film according to claim 20, wherein the addition amount of the water-soluble polymer having amino groups on the side chains is 0.00001 wt part or more and 1 wt part or less with respect to 100 wt parts of the abrasive slurry.

24. The CMP abrasive slurry for polishing insulation film according to claim 20, further containing a water-soluble nonionic compound.

25. The CMP abrasive slurry for polishing insulation film according to claim 20, wherein the addition amount of the water-soluble nonionic compound is 0.00001 wt part or more and 1 wt part or less with respect to 100 wt parts of the abrasive slurry.

26. The CMP abrasive slurry for polishing insulation film according to claim 20, wherein the average diameter of the cerium oxide particles is 80 nm to 1,000 nm and the addition amount of the cerium oxide particles is 0.1 wt part or more and 15 wt parts or less with respect to 100 wt parts of the abrasive slurry.

27. The CMP abrasive slurry for polishing insulation film according to claim 20, wherein said water-soluble polymer has a weight-average molecular weight of at least 500.

28. The CMP abrasive slurry for polishing insulation film according to claim 20, wherein the slurry has a pH of 4 or more and 10 or less.

29. A CMP abrasive slurry for polishing insulation film comprising cerium oxide particles, a dispersant, a water-soluble polymer having amino groups on the side chains, and water,
wherein the water-soluble polymer having amino groups on the side chains is a polymer prepared by polymerization of compounds comprising:
at least one compound represented by the following General Formula (III):

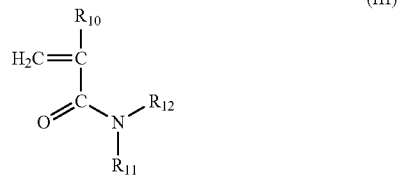

(in Formula (III), $R_{10}$ represents a hydrogen atom, a lower alkyl group, a phenyl group, a benzyl group, a halogen-substituted lower alkyl group, or a cyano group; $R_{11}$ and $R_{12}$ each represent a hydrogen atom, a $C_1$-$C_{18}$ alkyl group, a lower hydroxyalkylene group, or an acyl group; and $R_{11}$ and $R_{12}$ may bind to each other, forming a morpholino, thiomorpholino, pyrrolidino, or piperidino group), and at least one compound selected from the group consisting of N-methylaminoethyl acrylate, N,N-dimethylaminoethyl acrylate, N-ethylaminoethyl acrylate, N,N-diethylaminoethyl acrylate, N-methylaminopropyl acrylate, N,N-dimethylaminopropyl acrylate, N-ethylaminopropyl acrylate, N-ethylaminopropyl acrylate, N,N-diethylaminopropyl acrylate, N-methylaminoethyl methacrylate, N-ethylaminoethyl methacrylate, N-methylaminopropyl methacrylate, N,N-dimethylaminopropyl methacrylate, N-ethylaminopropyl methacrylate, N,N-dimethylaminopropyl methacrylate, N-methylaminopropylacrylamide, N-ethylaminopropylacrylamide, N,N-diethylaminopropylacrylamide, N-methylaminopropyl methacrylamide, N,N-dimethylaminopropyl methacrylamide, N-ethylaminopropyl methacrylamide, and N,N-diethylaminopropyl methacrylamide, wherein the water-soluble polymer having amino groups on the side chains is a polymer prepared by polymerization of compounds consisting of said at least one compound represented by the General Formula (III) and said at least one compound selected from the group consisting of N-methylaminoethyl acrylate, N,N-dimethylaminoethyl acrylate, N-ethylaminoethyl acrylate, N,N-diethylaminoethyl acrylate, N-methylaminopropyl acrylate, N,N-dimethylaminopropyl acrylate, N-ethylaminopropyl acrylate, N-ethylaminopropyl acrylate, N,N-diethylaminopropyl acrylate, N-methylaminoethyl methacrylate, N-ethylaminoethyl methacrylate, N-methylaminopropyl methacrylate, N,N-dimethylaminopropyl methacrylate, N-ethylaminopropyl methacrylate, N,N-dimethylaminopropyl methacrylate, N-methylaminopropylacrylamide, N-ethylaminopropylacrylamide, N,N-diethylaminopropylacrylamide, N-methylaminopropyl methacrylamide, N,N-dimethylaminopropyl methacrylamide, N-ethylaminopropyl methacrylamide, and N,N-diethylaminopropyl methacrylamide.

30. The CMP abrasive slurry for polishing insulation film according to claim 29, wherein the water-soluble polymer included in the slurry is a material in addition to the dispersant.

* * * * *